United States Patent
Oh

(10) Patent No.: US 11,729,925 B2
(45) Date of Patent: Aug. 15, 2023

(54) MOUNTING BRACKET WITH ANGLED MOUNTING OPENINGS FOR ELECTRICAL BOXES

(71) Applicant: ERICO International Corporation, Solon, OH (US)

(72) Inventor: Michael Hung-Sun Oh, Twinsburg, OH (US)

(73) Assignee: ERICO International Corporation, Solon, OH (US)

( * ) Notice: Subject to any disclaimer, the term of this patent is extended or adjusted under 35 U.S.C. 154(b) by 64 days.

(21) Appl. No.: 17/348,185

(22) Filed: Jun. 15, 2021

(65) Prior Publication Data

US 2022/0400561 A1 Dec. 15, 2022

(51) Int. Cl.
*F16M 11/00* (2006.01)
*H05K 5/02* (2006.01)

(52) U.S. Cl.
CPC ......... *H05K 5/0204* (2013.01); *H05K 5/0217* (2013.01)

(58) Field of Classification Search
CPC ...... H05K 5/0204; H05K 5/0217; H02G 3/14; H02G 3/018; H02G 3/126
See application file for complete search history.

(56) References Cited

U.S. PATENT DOCUMENTS

| 2,711,876 | A | 6/1955 | Goebel |
| 2,788,187 | A | 4/1957 | Cookson et al. |
| 4,328,903 | A | 5/1982 | Baars |
| 4,533,060 | A | 8/1985 | Medlin |
| 4,572,391 | A | 2/1986 | Medlin |
| 4,580,689 | A | 4/1986 | Slater |
| 4,603,789 | A | 8/1986 | Medlin, Sr. |
| 4,666,055 | A | 5/1987 | Lewis |
| 5,176,345 | A | 1/1993 | Medlin |
| 5,263,676 | A | 11/1993 | Medlin, Jr. et al. |
| 5,434,359 | A | 7/1995 | Schnell |
| D376,922 | S | 12/1996 | Hieber |

(Continued)

FOREIGN PATENT DOCUMENTS

| CA | 2577637 A1 | 2/2007 |
| WO | 2009/015041 A2 | 1/2009 |

OTHER PUBLICATIONS

Orbit Industries, Inc., Universal Mounting Adaptor with Back Support, specification sheet, www.orbitelectric.com, 1 page, undated.

(Continued)

*Primary Examiner* — Amy J. Sterling
(74) *Attorney, Agent, or Firm* — Quarles & Brady LLP

(57) ABSTRACT

A mounting bracket for electrical boxes that can include a mounting body with a plurality of mounting features. The plurality of mounting features can include a first set of mounting openings that can have respective elongate directions extending in parallel. The mounting body can have a mounting body axis extending across a shortest between opposing first and second sides of the mounting body. The elongate directions of the first set of mounting openings can be disposed at an acute angle relative to the mounting body axis. The first set of mounting openings can be configured to receive a plurality of fasteners to attach the mounting bracket to a first electrical box.

20 Claims, 12 Drawing Sheets

(56) References Cited

U.S. PATENT DOCUMENTS

| | | | |
|---|---|---|---|
| 5,595,362 A * | 1/1997 | Rinderer | H02B 1/46 |
| | | | 220/3.9 |
| 5,703,327 A | 12/1997 | Jorgensen | |
| 5,954,304 A | 9/1999 | Jorgensen | |
| 6,229,087 B1 | 5/2001 | Archer | |
| 6,332,597 B1 | 12/2001 | Korcz et al. | |
| D462,939 S | 9/2002 | Dinh | |
| 6,799,982 B2 | 10/2004 | Kerr et al. | |
| 6,871,827 B2 | 3/2005 | Petak et al. | |
| 7,036,782 B2 | 5/2006 | Cheatham et al. | |
| D539,125 S | 3/2007 | Hau et al. | |
| D539,128 S | 3/2007 | Hau et al. | |
| 7,300,025 B2 | 11/2007 | Korcz | |
| 7,439,443 B2 | 10/2008 | Dinh | |
| 7,468,486 B2 | 12/2008 | Yan | |
| D590,235 S | 4/2009 | Yan | |
| D612,226 S | 3/2010 | Dinh | |
| 7,798,458 B2 | 9/2010 | Borbolla et al. | |
| 7,802,765 B2 | 9/2010 | Thieman | |
| 7,902,457 B2 | 3/2011 | Johnson | |
| 7,923,635 B2 | 4/2011 | Korcz et al. | |
| 8,021,007 B2 | 9/2011 | Rapeanu | |
| 8,042,776 B2 * | 10/2011 | Johnson | H02G 3/126 |
| | | | 248/220.21 |
| 8,403,289 B1 * | 3/2013 | Rinderer | H02G 3/126 |
| | | | 220/3.9 |
| 8,658,894 B1 | 2/2014 | Witherbee | |
| 8,669,471 B2 | 3/2014 | Temblador et al. | |
| 9,559,504 B2 | 1/2017 | Jones | |
| 9,564,744 B2 | 2/2017 | Jaffari et al. | |
| 9,653,899 B2 * | 5/2017 | Salian | F16B 5/0016 |
| 9,780,545 B2 | 10/2017 | Witherbee | |
| D803,665 S | 11/2017 | Vrame | |
| 9,853,431 B2 | 12/2017 | Jones | |
| D821,849 S | 7/2018 | Nikayin et al. | |
| D841,434 S | 2/2019 | Vrame | |
| D887,252 S | 6/2020 | Zhang et al. | |
| 10,711,940 B2 | 7/2020 | Witherbee | |
| 10,923,895 B2 | 2/2021 | Korez et al. | |
| D913,080 S | 3/2021 | Witherbee et al. | |
| 11,248,740 B2 * | 2/2022 | Witherbee | H02G 3/126 |
| 11,296,489 B2 * | 4/2022 | Oh | H02G 3/081 |
| 2010/0025066 A1 | 2/2010 | De La Borbolla | |
| 2010/0078532 A1 | 4/2010 | Whipple et al. | |
| 2010/0179138 A1 | 7/2010 | Zacharevitz et al. | |
| 2010/0270446 A1 | 10/2010 | Phillips | |
| 2010/0282933 A1 | 11/2010 | Phillips | |
| 2016/0099555 A1 | 4/2016 | Nikayin et al. | |
| 2019/0376643 A1 | 12/2019 | Witherbee et al. | |
| 2020/0378553 A1 | 12/2020 | Oh et al. | |
| 2021/0006055 A1 | 1/2021 | Korez et al. | |
| 2021/0025543 A1 | 1/2021 | Witherbee | |

OTHER PUBLICATIONS

Ruff-In Pre-Fab Systems, Eaton, copyright 2017; 24 pages.
Orbit Industries' Universal Mounting Adaptor, Jun. 6, 2018, Website https://electricalnews.com/orbit-industries-universal-mounting-adapter-with-back-support/.
Hubbel Wiring Device—Kellems, Wall Switch Sensors product sheet, eCatalog, Hubbel Incorporated, undated 1 page.
Hubbel Three Gang Universal Metal Flip Covers #MX3050S product sheet, www.hubbel.com, undated, 1 page.
SP Products, Inc "Big O" Flat Conduit and Box Supports for Stud Walls product sheet, www.spproducts.com, undated, 1 page.
Orbit Industries, Inc., Flat Bracket Family product sheet, www.orbitelectric.com, undated, 1 page.
Orbit Electric, 3 Box Positions Flat Box Mounting Bracket For 16" Stud, website screen shot, www.orbitelectric.com/fb-3, retrieved from the Internet Jul. 16, 2020, 1 page.

* cited by examiner

MOUNTING BRACKET WITH ANGLED MOUNTING OPENINGS FOR ELECTRICAL BOXES

BACKGROUND

In many applications, it may be useful to support electrical boxes and other components. For example, according to some construction standards, electrical boxes may be required to be installed on a support member (e.g., a wall stud)

SUMMARY

Some embodiments of the invention provide a mounting bracket for electrical boxes. The mounting bracket can include a mounting body with a plurality of mounting features that can include a first set of mounting openings with respective elongate directions extending in parallel with each other. The mounting body can have a mounting body axis extending laterally across a shortest distance between opposing first and second sides of the mounting body. The elongate directions of the first set of mounting openings can be disposed at an acute angle relative to mounting body axis. The first set of mounting openings can be configured to receive a plurality of fasteners to attach an electrical box to the mounting bracket.

Some embodiments of the invention provide a mounting bracket for electrical boxes. The mounting bracket can include a mounting body having a plurality of mounting features, including a first set of mounting openings and a second set of mounting openings. The first set of mounting openings can include a first mounting opening and a second mounting opening, and the second set of mounting openings can include a third mounting opening and a fourth mounting opening. The first mounting opening can be positioned adjacent a first side of the mounting body and the second mounting opening can be positioned adjacent a second side of the mounting body cater-cornered from the first mounting opening across a central opening. The first and second mounting openings can extend along parallel elongate directions disposed at an oblique angle relative to a mounting body axis configured to be horizontal relative to ground, upon installation of the mounting body. The third mounting opening can be positioned adjacent the second side of the mounting body laterally spaced from the first mounting opening and the fourth mounting opening can be positioned adjacent the first side of the mounting body cater-cornered from the third mounting opening across the central opening and laterally spaced from the second mounting opening. The third and fourth mounting openings can extend along parallel elongate directions disposed at an oblique angle relative to the mounting body axis.

Some embodiments can provide a method of installing an electrical box on a mounting bracket. The method can include inserting a plurality of fasteners that are engaged with the electrical box into a plurality of mounting features in a mounting body of the mounting bracket. Further, translating the fasteners within the mounting features by moving the box at an oblique angle relative to the mounting bracket, to secure the electrical box to the mounting bracket.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
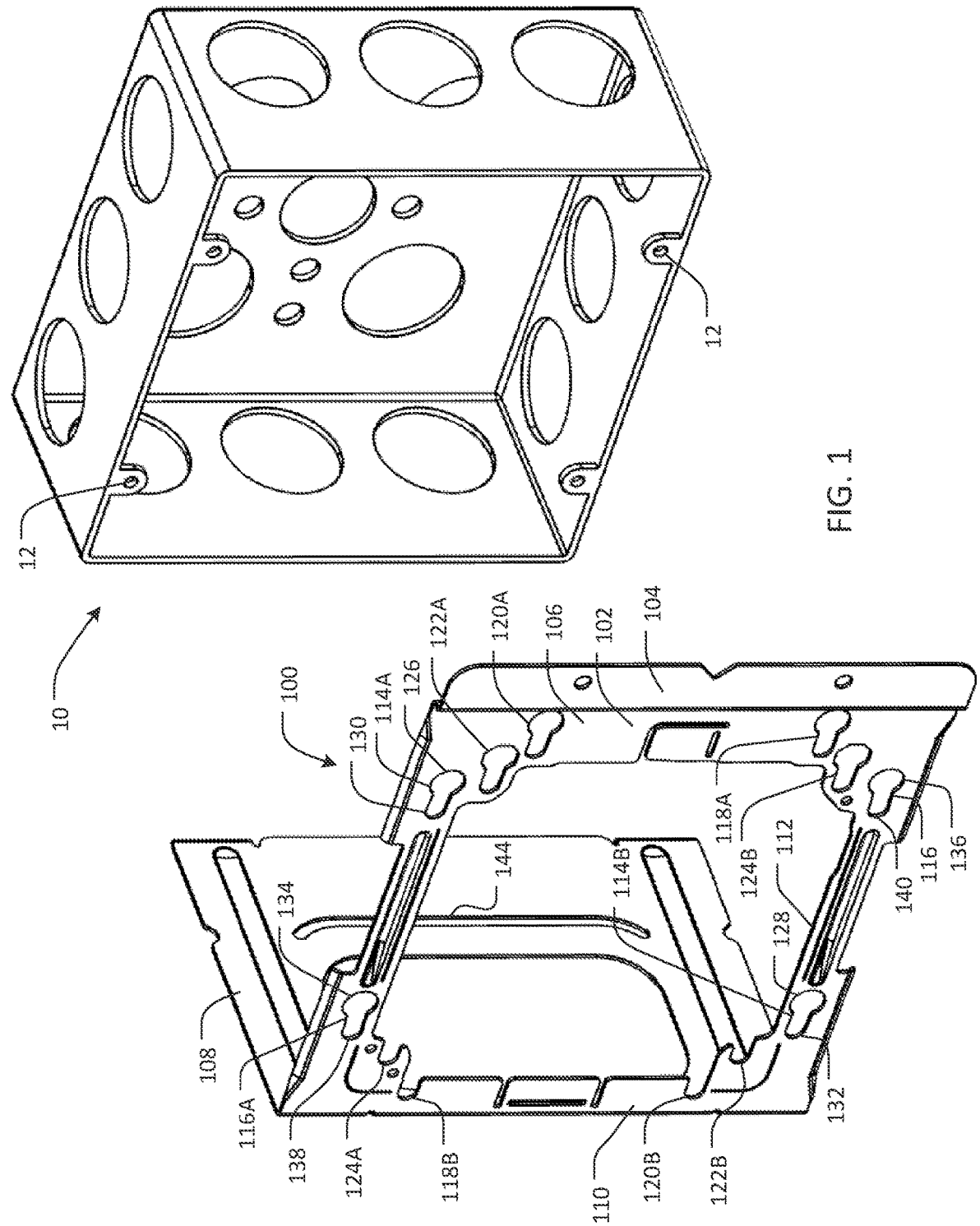
FIG. 1 is a front top right isometric view of a mounting bracket according to an embodiment of the invention and an electrical box.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise specified or limited, directional terms are presented only with regard to the particular embodiment and perspective described. For example, reference to features or directions as "horizontal," "vertical," "front," "rear," "left," "right," "upper," "lower," and so on are generally made with reference to a particular figure or example and are not necessarily indicative of an absolute orientation or direction. However, relative directional terms for a particular embodiment may generally apply to alternative orientations of that embodiment. For example, "front" and "rear" directions or features (or "right" and "left" directions or features, and so on) may be generally understood to indicate relatively opposite directions or features for a particular embodiment, regardless of the absolute orientation of the embodiment (or relative orientation relative to environmental structures). "Lateral" and derivatives thereof generally indicate directions that are generally perpendicular to a vertical direction for a relevant reference frame.

Also as used herein, ordinal numbers are used for convenience of presentation only and are generally presented in an order that corresponds to the order in which particular features are introduced in the relevant discussion. Accordingly, for example, a "first" feature may not necessarily have any required structural or sequential relationship to a "second" feature, and so on. Further, similar features may be referred to in different portions of the discussion by different ordinal numbers. For example, a particular feature may be referred to in some discussion as a "first" feature, while a similar or substantially identical feature may be referred to in other discussion as a "third" feature, and so on.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, in some contexts, it may be useful to support electrical boxes and other components relative to structures. Embodiments of the invention can be useful for this purpose, and others. For example, embodiments of the invention can be used to support one or more electrical boxes, mud rings, or other electrical components on a support at a configurable distance away from supporting structures, such as wall studs, or in other orientations.

In some embodiments, a mounting bracket can include a first set of mounting openings for mounting an electrical box thereto that are angled (e.g., obliquely angled) relative to a reference axis of the mounting bracket. The first set of mounting openings can include mounting openings that each have an elongate direction and extend in parallel. In some cases, the mounting openings can be located diagonally from each other across a central opening that provides access to an interior of an attached electrical box. As well as generally improving installation processes and provide related structural benefits, the angle of the mounting openings can provide additional material between the mounting openings and the central opening, which can generally enhance the integrity of the mounting bracket.

In some embodiments, a mounting bracket can have multiple sets of mounting openings for mounting an electrical box thereto. At least two of the sets of mounting openings can include mounting openings that are angled relative to a reference axis of the mounting bracket (e.g., a laterally extending axis configured to be parallel to ground after installation) to provide a varying amount of material between the mounting openings and a central opening in the bracket along the length of the mounting openings. In some cases, other sets of mounting openings can extend in parallel with the reference axis. In some embodiments, the mounting bracket can include different sets of mounting openings configured for attaching electrical boxes of different sizes. In some embodiments, apertures in the mounting bracket can be provided that allow a mud ring to be directly attached to the mounting bracket.

In some embodiments, a mounting bracket can include sets of mounting openings that all extend in generally one direction. In some embodiments, a mounting opening has a elongate direction extending from a receiving end to a terminal end of the mounting opening (e.g., from an enlarged portion configured to receive a head of a fastener to a narrower, slot portion configured to receive a shaft of the fastener). In some embodiments, the elongate directions of all of the mounting openings can extend toward a second side of the mounting bracket, wherein the second side of the mounting bracket is opposite a first side configured to be attached to a structural support. In some embodiments, the elongate directions of all of the mounting openings can extend toward a first side of a mounting bracket.

In some contexts, it may be useful to provide a mounting bracket that allows attachment of an electrical box in different orientations. In some embodiments, the mounting bracket can have multiple sets of mounting features, each set configured to be alignable with mounting holes or associated fasteners of an electrical box. For electrical boxes that are not rotationally symmetrical with respect to their mounting holes, a second set of mounting features can be provided on the mounting bracket, configured to align with the mounting holes of the electrical box when the electrical box is rotated 90 degrees from a first orientation in which the mounting holes align with a first set of mounting features.

In some conventional arrangements, a central opening of a mounting bracket must be made smaller to provide enough material around mounting openings to which electrical boxes are mounted to maintain the integrity of the mounting bracket. The smaller central opening can be the cause of some irritation for an electrician because size of the access opening into the electrical box is thereby reduced. This can make securing conduit to the electrical box and making wire splices within the electrical box more cumbersome.

Some embodiments of the invention can address this issue, or others. For example, some embodiments of the invention are presented below in the context of mounting brackets for electrical boxes, wherein the mounting brackets have at least one set of angled mounting openings. The angled mounting openings can allow the central opening of a mounting bracket to be bigger by making economical use of the space on the mounting bracket, as well as otherwise generally improving installation processes and reliability.

With regard to construction, each of the embodiments presented below can be readily formed as an integral stamping, with mechanical or other (e.g., welded, adhesive-based, etc.) attachment of other components, as needed. In other embodiments, however, other manufacturing techniques can be used, including extrusion, additive manufacturing, casting, and so on. Further, although particular configurations of support bodies with mounting openings are illustrated, the principles of alignment discussed below can be applied to a wide variety of other mounting bodies (e.g., other known stud-mounted or other mounting brackets).

Figure 2:
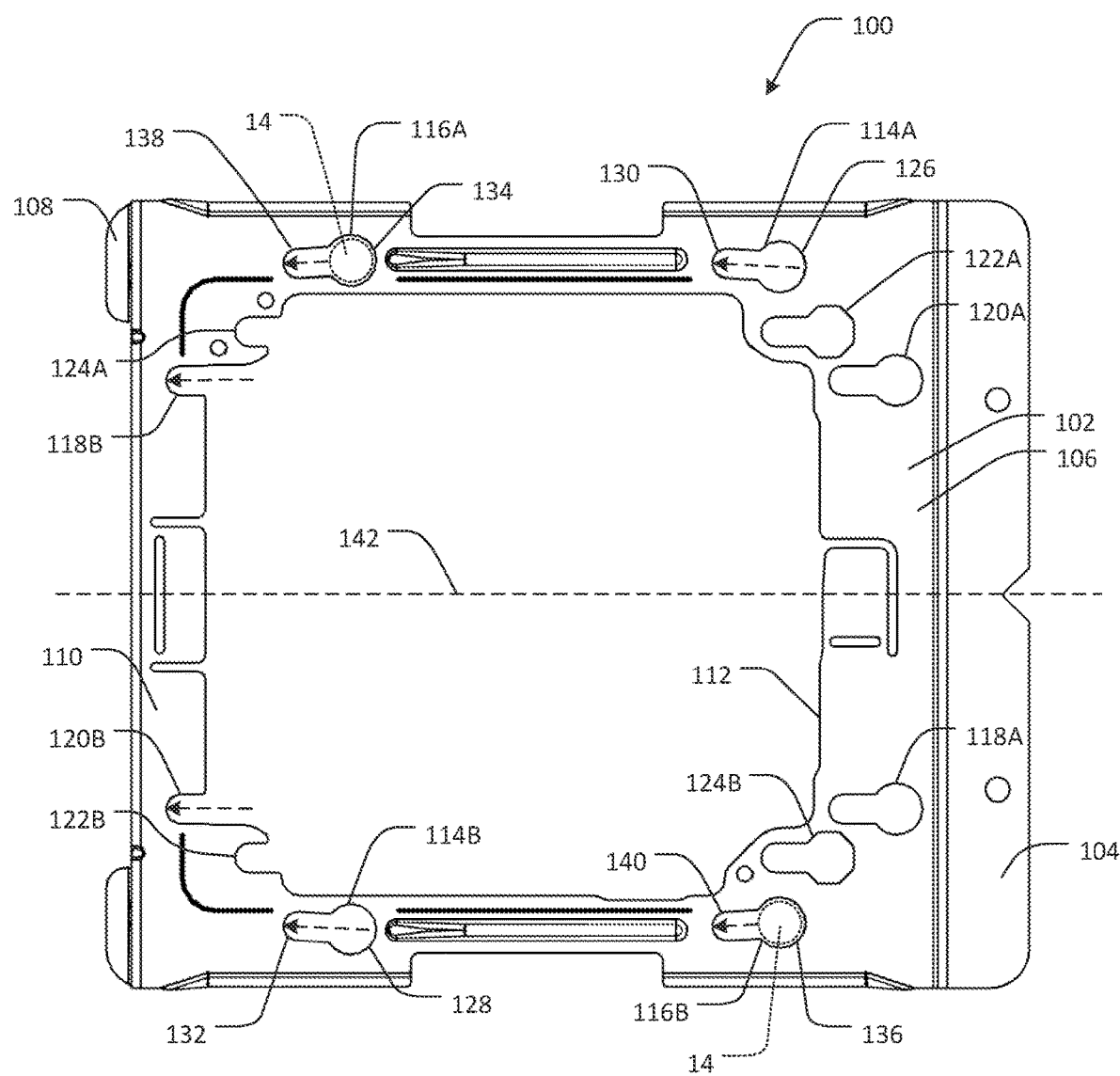
FIG. 2 is a front elevation view of the mounting bracket of FIG. 1.

FIGS. 1 and 2 illustrate an embodiment of a mounting bracket 100 configured for mounting an electrical box thereto. As illustrated, the mounting bracket 100 is formed as a stamping from a single blank of material (e.g., 22 gauge or 23 gauge pre-galvanized steel), although a variety of other approaches are possible. In the illustrated embodiment, the mounting bracket 100 includes a mounting body 102, a mounting flange 104 on a first side 106 of the mounting body 102, a far side support 108 extending from a second side 110 of the mounting body 102 opposite the first side 106, and a central opening 112.

Continuing, the mounting flange 104 and the far side support 108 are configured to securely attaching the mounting bracket 100 to a wall support member (e.g., a wall stud) (not shown). The mounting flange 104 is configured to engage a wall stud to mount the mounting bracket 100 thereto by being placed flush against the face of the wall stud and secured with fasteners. The far side support 108 is configured to extend perpendicularly from the mounting body 102 to engage with an inside surface of a wall covering (e.g., drywall) attached to the face of the wall stud opposite the face attached to the mounting flange 104. The far side support 108 can stabilize the mounting body 102 and prevent the mounting body 102 from being pushed back into the wall space during construction, during installation of electrical devices, and during use (e.g., in the case of an electrical outlet coupled to the mounting bracket 100, when an electrical device is plugged into the electrical outlet). The far side support 108 can be configured to accommodate multiple wall depths, for example, a wall depth of 2.5 in. when bent at a relief 144 or 3.625 in. when remaining unbent (as shown in FIG. 1).

The mounting body 102 is further characterized by having a mounting body axis 142. The mounting body axis 142 extends across the shortest distance between the first and second sides 106, 110 of the mounting body 102 and in most installation scenarios is generally configured to extend in parallel with the ground (i.e., horizontally) when the mounting body 102 is installed.

The mounting body 102 further contains features for the attachment of an electrical box to the mounting bracket 100. For example, the mounting body 102 includes a variety of mounting features, including a first set of mounting openings (including first and second mounting openings 114A, 114B), a second set of mounting openings (including third and fourth mounting openings 116A, 116B), a third set of mounting openings (including fifth and sixth mounting openings 118A, 118B), a fourth set of mounting openings (including seventh and eighth mounting openings 120A, 120B), a fifth set of mounting openings (including ninth and tenth mounting openings 122A, 122B), and a sixth set of mounting openings (including eleventh and twelfth mounting openings 124A, 124B). Some of the mounting openings are enclosed and formed as fully enclosed keyhole openings, for example, the first, second, third, fourth, fifth, seventh, ninth, and twelfth mounting openings 114A, 114B, 116A, 116B, 118A, 120A, 122A, 124B, and some of the mounting openings are open and formed as slots along the periphery of the central opening 112, for example, the sixth, eighth, tenth, and eleventh mounting openings 118B, 120B, 122B, 124A are open slots.

The elongate direction for the first, second, third, fourth, fifth, seventh, ninth, and twelfth mounting openings 114A, 114B, 116A, 116B, 118A, 120A, 122A, 124B can be defined as the direction of a straight line extending across the longest distance within each of the mounting openings 114A, 114B, 116A, 116B, 118A, 120A, 122A, 124B, or, more generally, from a receiving end to a terminal end of the relevant mounting opening. For example, in FIG. 2, dashed arrows are shown within the first, second, third, and fourth mounting openings 114A, 114B, 116A, 116B to indicate the elongate direction thereof. The elongate direction of for the sixth, eighth, tenth, and eleventh mounting openings 118B, 120B, 122B, 124A (i.e., open slots) can be defined as the direction of a straight line extending from the central opening 112, along a longitudinal axis of the mounting opening 118B, 120B, 122B, 124A and to a terminal end of the mounting opening 118B, 120B, 122B, 124A. For example, in FIG. 2, dashed arrows are shown within the sixth and eighth mounting openings 118B, 120B to indicate the elongate direction thereof. It should be noted that other configurations of open and enclosed mounting openings are contemplated. In some embodiments, the mounting openings of each set of mounting openings are diagonally spaced (i.e., cater-corner) from each other.

Continuing to look at the mounting features in FIG. 2, each of the enclosed mounting openings 114A, 114B, 116A, 116B, 118A, 120A, 122A, and 124B has an elongate direction starting from a receiving end extending toward a terminal end. For example, the first and second mounting openings 114A, 114B of the first set of mounting openings each have elongate directions starting from a receiving end 126, 128 and extending toward a terminal end 130, 132 of the respective mounting opening 114A, 114B. In some embodiments, the elongate directions of the first and second mounting openings 114A, 114B are parallel. Similarly, the third and fourth mounting openings 116A, 116B of the second set of mounting openings also have a elongate directions starting from a receiving end 134, 136 and extending toward a terminal end 138, 140.

In some embodiments, some of the mounting features can be obliquely angled relative to the mounting body axis 142 or, more generally, obliquely angled relative to an as-installed horizontal direction. For example, as shown in FIG. 2, the elongate direction for the first mounting opening 114A extends toward the second side 110 of the mounting body 102 (i.e., from right to left as viewed in FIG. 2) and is angled away from the central opening 112 at an acute angle relative to the mounting body axis 142, and the elongate direction for the second mounting opening 114B extends toward the second side 110 of the mounting body 102 (i.e., from right to left as viewed in FIG. 2) and is angled toward the central opening 112 at an acute angle relative to the mounting body axis 142. In some embodiments, the angle can be in the range of about 1 degree to about 5 degrees. In some embodiments, the angle can be about 2.5 degrees. The angle of the first and second mounting openings 114A, 114B allows for more material of the mounting body 102 to be located at least between the receiving end 126 of the second mounting opening 114B and the central opening 112 as well as otherwise generally improving installation and retention of an attached electrical box. In other embodiments, the angle at which the elongate directions of the first and second mounting openings 114A, 114B are disposed from the mounting body axis 142 can be altered from that shown without deviating from the invention.

Continuing to look at the mounting features, each of the sets of mounting openings are configured to receive fasteners (e.g., fasteners 14 shown in FIG. 2 in dashed lines) from an electrical box 10 to attach the electrical box 10 to the mounting bracket 100. Typically, electrical boxes will be sold with fasteners already installed in threaded holes (e.g., holes 12 of the electrical box 10) located along the periphery of the open side of the box. The fasteners are generally located cater-cornered to provide the most secure mounting with the fewest number of fasteners. However, it is conceivable to have a box with fasteners at or near all four corners. In one example, the first and second mounting openings 114A and 114B are cater-cornered from each other and adjacent the central opening and are configured to receive fasteners 14 (shown in FIG. 2) included with an electrical box 10 (e.g., a $4^{11}/_{16}$ in. square electrical box as shown in FIG. 1). The parallel elongate directions of the first and second mounting openings 114A, 114B allow for the reception and translation of the fasteners 14 within the receiving ends 126, 128 of the first and second mounting openings 114A, 114B to the terminal ends 130, 132 when mounting the electrical box 10 to the mounting bracket 100.

Further, the second set of mounting openings (the third and fourth mounting openings 116A, 116B) are configured similarly to the first set of mounting openings (the first and second mounting openings 114A, 114B) but are angled differently with respect to the mounting body axis 142. As stated above, fasteners 14 (shown in FIG. 2) on an electrical box 10 (shown in FIG. 1) can be located on either set of cater-corner threaded holes 12 of the electrical box. The third and fourth mounting openings 116A, 116B provide for mounting an electrical box (e.g., a 4$^{11}/_{16}$ in. square electrical box) wherein the fasteners 14 (shown in FIG. 2) are located in the alternative set of holes than those discussed previously with respect to the first and second mounting openings 114A, 114B.

As shown in FIGS. 1 and 2, the elongate direction for the third mounting opening 116A extends toward the second side 110 of the mounting body 102 (i.e., from right to left as viewed in FIG. 2) and is angled toward the central opening 112 at an acute angle relative to the mounting body axis 142, and the elongate direction for the fourth mounting opening 116B extends toward the second side 110 of the mounting body 102 (i.e., from right to left as viewed in FIG. 2) and is angled away from the central opening 112 at an acute angle relative to the mounting body axis 142. In some embodiments, the angle can be in the range of about 1 degree to about 5 degrees. In some embodiments, the angle can be about 2.5 degrees. Similarly, the angle of the third and fourth mounting openings 116A, 116B allows for more material of the mounting body 102 to be located at least between the receiving end 134 of the third mounting opening 116A and the central opening 112. Again, in other embodiments, the angle at which the elongate directions of the third and fourth mounting openings 116A, 116B are disposed from the mounting body axis 142 can be altered from that shown without deviating from the invention. However, the elongate directions of the third and fourth mounting openings 116A, 116B are configured to be parallel to allow for the reception and moving of fasteners (e.g., fasteners 14 shown in FIG. 2) within the third and fourth mounting openings 116A, 116B when mounting the electrical box 10 to the mounting bracket 100.

Additionally, in some embodiments the elongate directions of the fifth, sixth, seventh, eighth, ninth, tenth, eleventh, and twelfth mounting openings 118A, 118B, 120A, 120B, 122A, 122B, 124A, 124B can be parallel with the mounting body axis 142 and extend toward the second side 110 of the mounting body 102 (i.e., from right to left as viewed in FIG. 2). In some embodiments, the third set of mounting openings (the fifth and sixth mounting openings 118A, 118B) can be configured, for example, to receive fasteners (e.g., fasteners 14 shown in FIG. 2) installed in a 4$^{11}/_{16}$ in. electrical box (e.g., electrical box 10 shown in FIG. 1) rotated 90 degrees from the orientation in which the fasteners 14 would be received within the first set of mounting openings (the first and second mounting openings 114A, 114B). In some embodiments, the fourth set of mounting openings (the seventh and eighth mounting openings 120A, 120B) can be configured, for example, to receive fasteners (e.g., fasteners 14 shown in FIG. 2) installed in a 4$^{11}/_{16}$ in. electrical box (e.g., electrical box 10 shown in FIG. 1) rotated 90 degrees from the orientation in which the fasteners would be received within the second set of mounting openings (the third and fourth mounting openings 116A, 116B). In some embodiments, the fifth set of mounting openings (the ninth and tenth mounting openings 122A, 122B) and the sixth set of mounting openings (the eleventh and the twelfth mounting openings (124A, 124B) can be configured, for example, to receive fasteners (e.g., fasteners 14 shown in FIG. 2) installed in a 4 in. electrical box in any of the four possible orientations.

Figure 3:
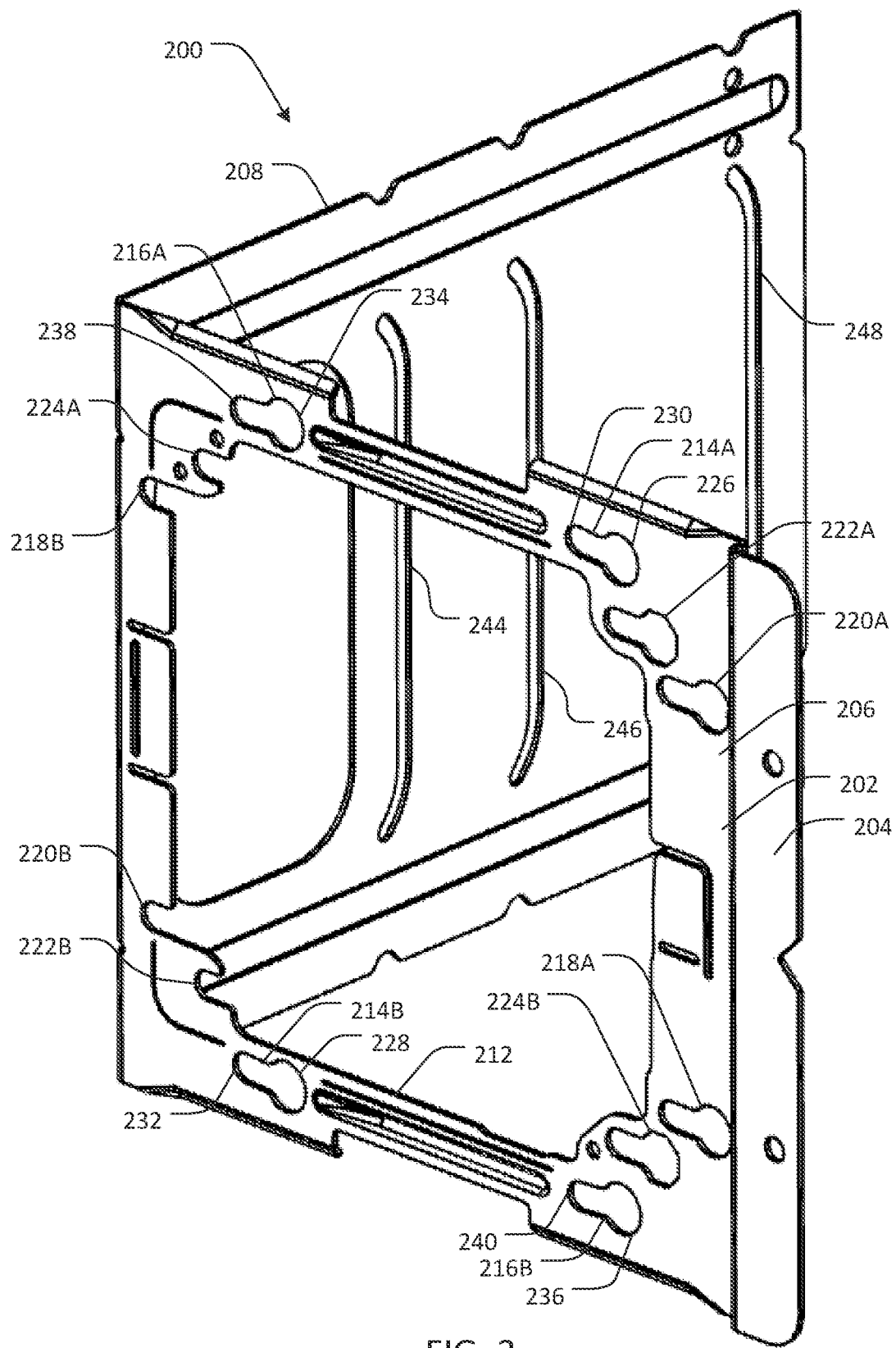
FIG. 3 is a front top right isometric view of a mounting bracket according to another embodiment of the invention.
Figure 4:
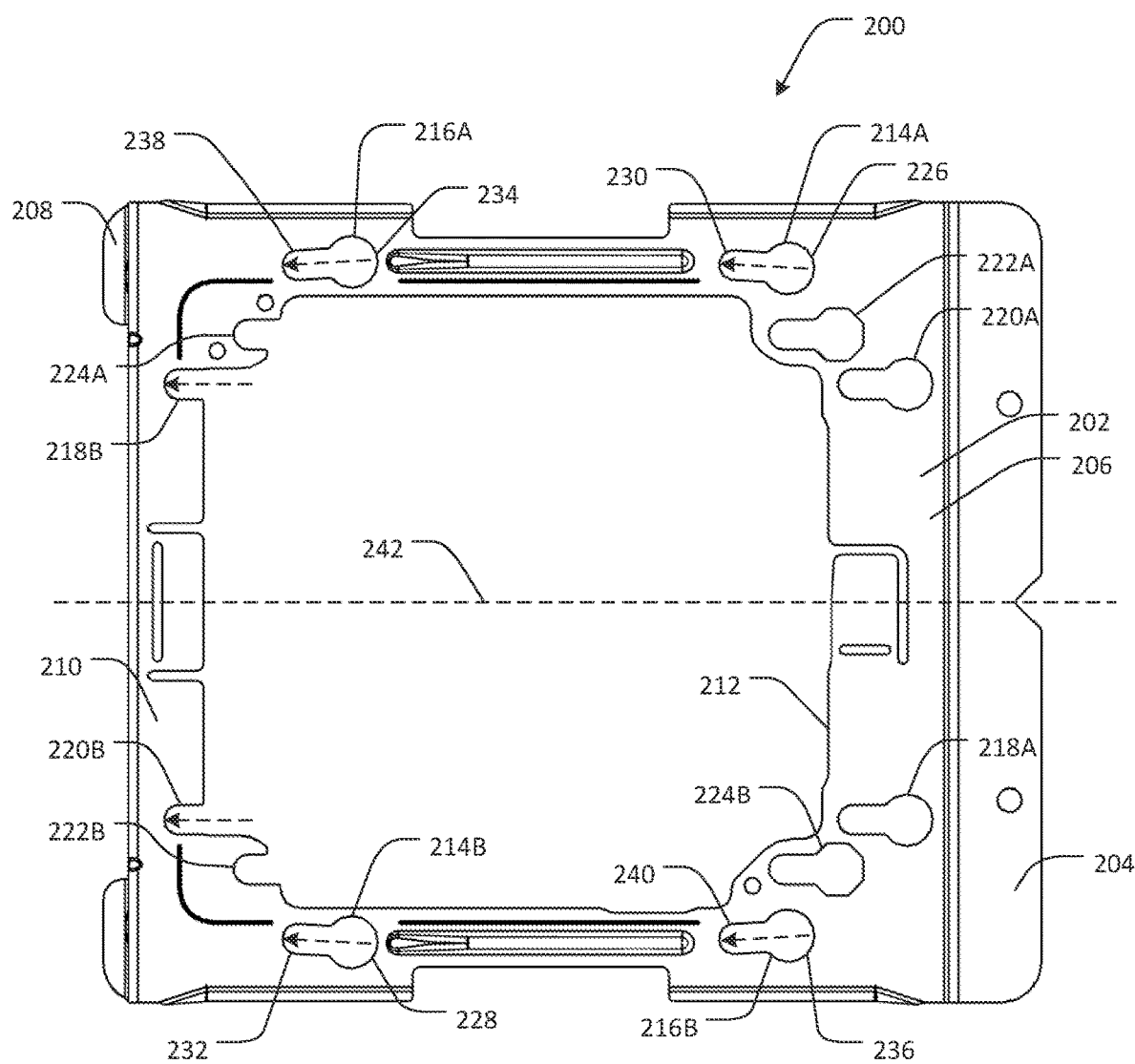
FIG. 4 is a front elevation view of the mounting bracket of FIG. 3.

FIGS. 3 and 4 illustrate another embodiment of a mounting bracket 200 according to the invention, as also can be configured to mount an electrical box (shown in FIG. 1) thereto. In many aspects, the mounting bracket 200 is similar to the mounting bracket 100 described above and similar numbering in the 200 series is used for the mounting bracket 200. For example, the mounting bracket 200 has a mounting body 202, a mounting flange 204 on a first side 206, a far side support 208 on a second side 210, a central opening 212, a first set of mounting openings (including first and second mounting openings 214A, 214B with receiving ends 226, 228 and terminal ends 230, 232, respectively), a second set of mounting openings (including third and fourth mounting openings 216A, 216B with receiving ends 234, 236 and terminal ends 238, 240, respectively), a third set of mounting openings (including fifth and sixth mounting openings 218A, 218B), a fourth set of mounting openings (including seventh and eighth mounting openings 220A, 220B), a fifth set of mounting openings (including ninth and tenth mounting openings 222A, 222B), a sixth set of mounting openings (including eleventh and twelfth mounting openings 224A, 224B), and a mounting body axis 242.

In some aspects, however, the mounting brackets 100, 200 differ from each other. For example, the far side support 208 can be configured to accommodate wall depths of 2.5 in. when bent at a first relief 244, 3.625 in. when bent at a second relief 246, 5.5 in. when bent at a third relief 248, or 6 in. when left unbent (as shown in FIG. 3).

Figure 5:
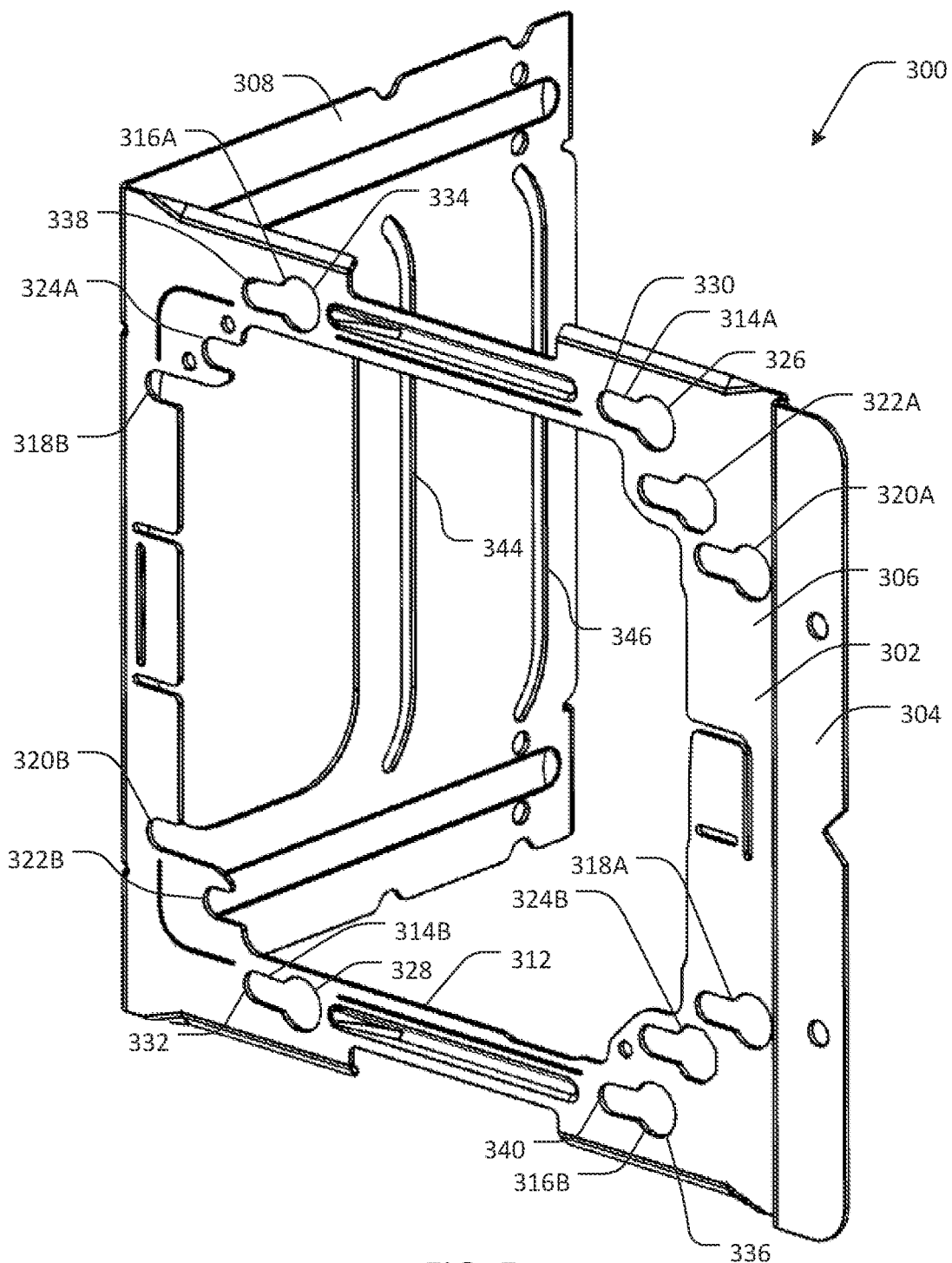
FIG. 5 is a front top right isometric view of a mounting bracket according to another embodiment of the invention.
Figure 6:
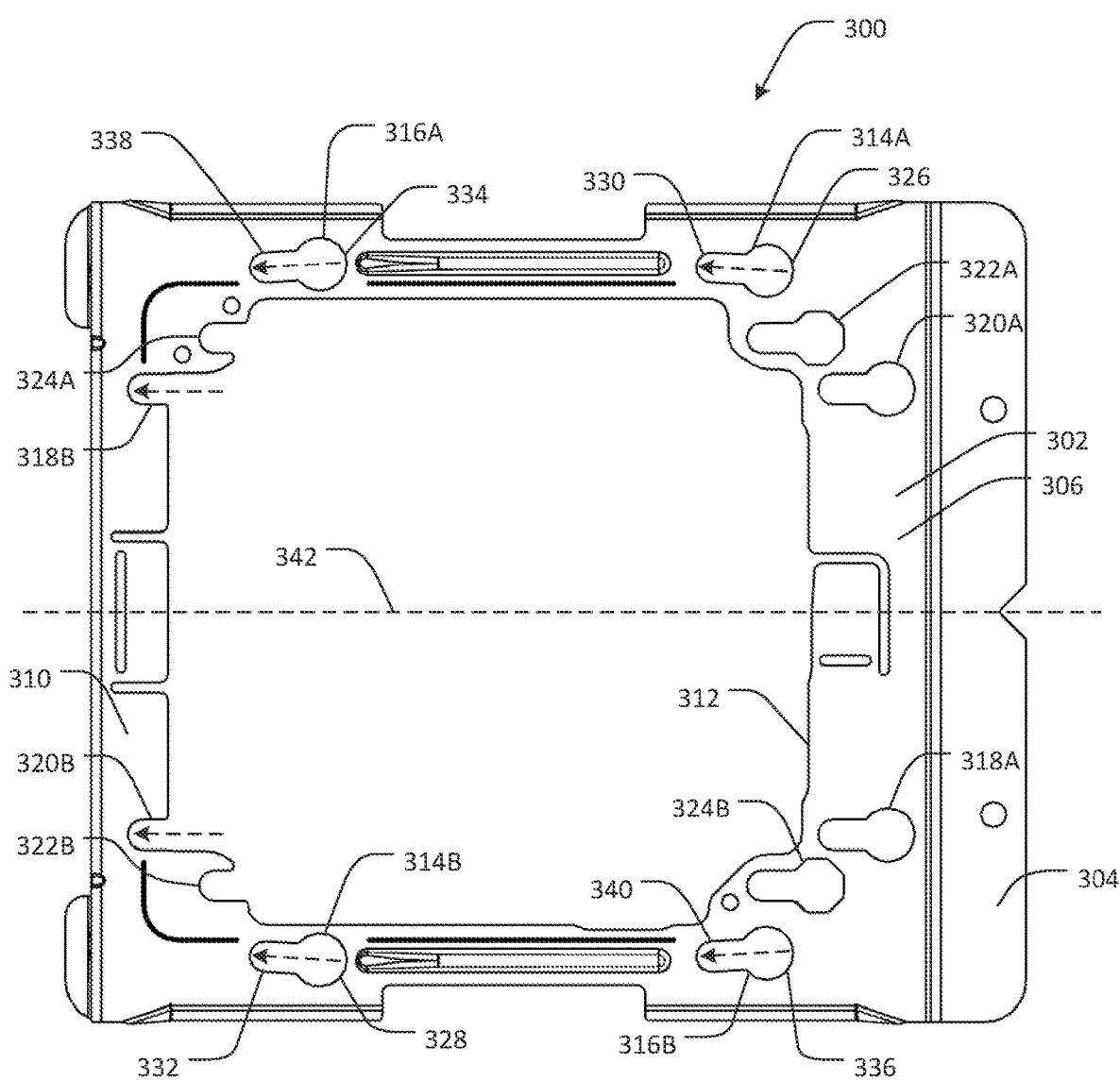
FIG. 6 is a front elevation view of the mounting bracket of FIG. 5.

FIGS. 5 and 6 illustrate another embodiment of a mounting bracket 300 according to the invention, as also can be configured to mount an electrical box (shown in FIG. 1) thereto. In many aspects, the mounting bracket 300 is similar to the mounting bracket 100 described above and similar numbering in the 300 series is used for the mounting bracket 300. For example, the mounting bracket 300 has a mounting body 302, a mounting flange 304 on a first side 306, a far side support 308 on a second side 310, a central opening 312, a first set of mounting openings (including first and second mounting openings 314A, 314B, with receiving ends 326, 328 and terminal ends 330, 332, respectively), a second set of mounting openings (including third and fourth mounting openings 316A, 316B, with receiving ends 334, 336 and terminal ends 338, 340, respectively), a third set of mounting openings (including fifth and sixth mounting openings 318A, 318B), a fourth set of mounting openings (including seventh and eighth mounting openings 320A, 320B), a fifth set of mounting openings (including ninth and tenth mounting openings 322A, 322B), a sixth set of mounting openings (including eleventh and twelfth mounting openings 324A, 324B), and a mounting body axis 342.

In some aspects, however, the mounting brackets 100, 300 differ from each other. For example, the far side support 308 can be configured to accommodate wall depths of 2.5 in. when bent at a first relief 344, 3.625 in. when bent at a second relief 346, or 4 in. when left unbent (as shown in FIG. 5).

Figure 7:
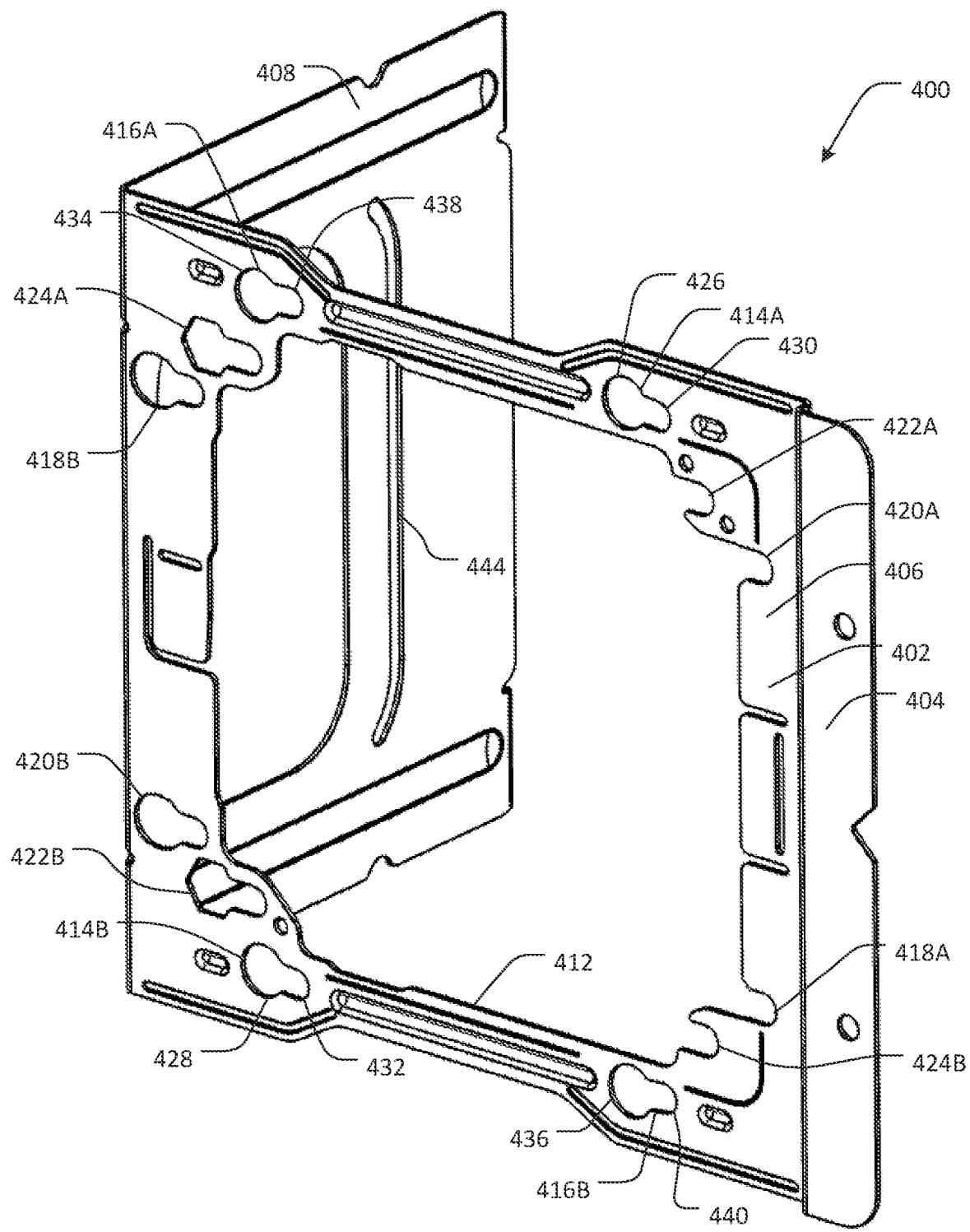
FIG. 7 is a front top right isometric view of a mounting bracket according to another embodiment of the invention.
Figure 8:
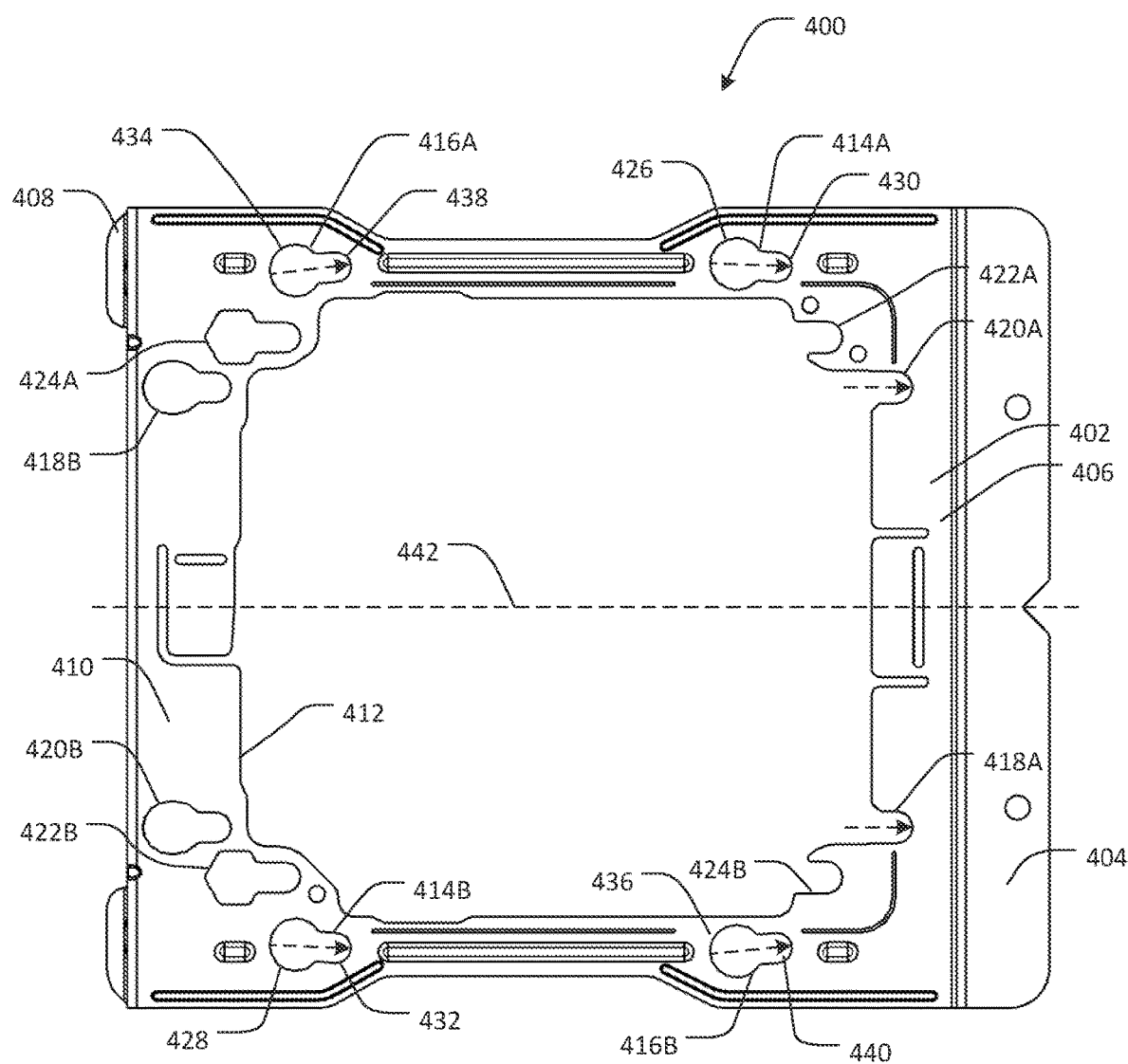
FIG. 8 is a front elevation view of the mounting bracket of FIG. 7.

FIGS. 7 and 8 illustrate another embodiment of a mounting bracket 400 according to the invention, as also can be configured to mount an electrical box 10 (shown in FIG. 1) thereto. In many aspects, the mounting bracket 400 is similar to the mounting bracket 100 described above and similar numbering in the 400 series is used for the mounting bracket 400. For example, the mounting bracket 400 has a mounting body 402, a mounting flange 404 on a first side 406, a far side support 408 on a second side 410, a central opening 412, a first set of mounting openings (including first and second mounting openings 414A, 414B, with receiving ends 426, 428 and terminal ends 430, 432, respectively), a second set of mounting openings (including third and fourth mounting openings 416A, 416B, with wider receiving (keyhole) ends 434, 436 and narrower terminal (slot) ends 438, 440, respectively), a third set of mounting openings (including fifth and sixth mounting openings 418A, 418B), a fourth set of mounting openings (including seventh and eighth mounting openings 420A, 420B), a fifth set of mounting openings (including ninth and tenth mounting openings 422A, 422B), a sixth set of mounting openings (including eleventh and twelfth mounting openings 424A, 424B), and a mounting body axis 442. The far side support 408 of the mounting bracket 400 can also be configured to accommodate wall depths of 2.5 in. when bent at a relief 444 or 3.625 in. when left unbent (as shown in FIG. 7).

In some aspects, however, the mounting brackets 100, 400 differ from each other. For example, as shown in FIG. 8, the elongate direction for the first mounting opening 414A extends toward the first side 406 of the mounting body 402 (i.e., from left to right as viewed in FIG. 8 and illustrated with a dashed arrow) and is angled toward the central opening 412 at an acute angle relative to the mounting body axis 442, and the elongate direction for the second mounting opening 414B extends toward the first side 406 of the mounting body 402 (i.e., from left to right as viewed in FIG. 8 and illustrated with a dashed arrow) and angles away from the central opening 412 at an acute angle relative to the mounting body axis 442. In some embodiments, the angle can be in the range of about 1 degree to about 5 degrees. In some embodiments, the angle can be about 2.5 degrees.

Additionally, the elongate directions for the third and fourth mounting openings 416A, 416B of the mounting bracket 400 are different than the elongate directions for the third and fourth mounting openings 116A, 116B of the mounting bracket 100. The elongate direction for the third mounting opening 416A extends toward the first side 406 of the mounting body 402 (i.e., from left to right as viewed in FIG. 8 and illustrated with a dashed arrow) and is angled away from the central opening 412 at an acute angle relative to the mounting body axis 442, and the elongate direction for the fourth mounting opening 416B extends toward the first side 406 of the mounting body 402 (i.e., from left to right as viewed in FIG. 8 and illustrated with a dashed arrow) and is angled toward the central opening 412 at an acute angle relative to the mounting body axis 442. In some embodiments, the angle can be in the range of about 1 degree to about 5 degrees. In some embodiments, the angle can be about 2.5 degrees.

Further, the configurations of the third, fourth, fifth, and sixth set of mounting openings are different in the mounting bracket 400. For example, the mounting hole openings 418A, 420A, 422A, 424B are formed as slots along the periphery of the central opening 412, and the mounting openings 418B, 420B, 422B, 424A are formed as keyholes. Additionally, the elongate directions for the mounting openings 418A, 418B, 420A, 420B, 422A, 422B, 424A, 424B extend toward the first side 406 of the mounting body (i.e., from left to right as viewed in FIG. 8).

Figure 9:
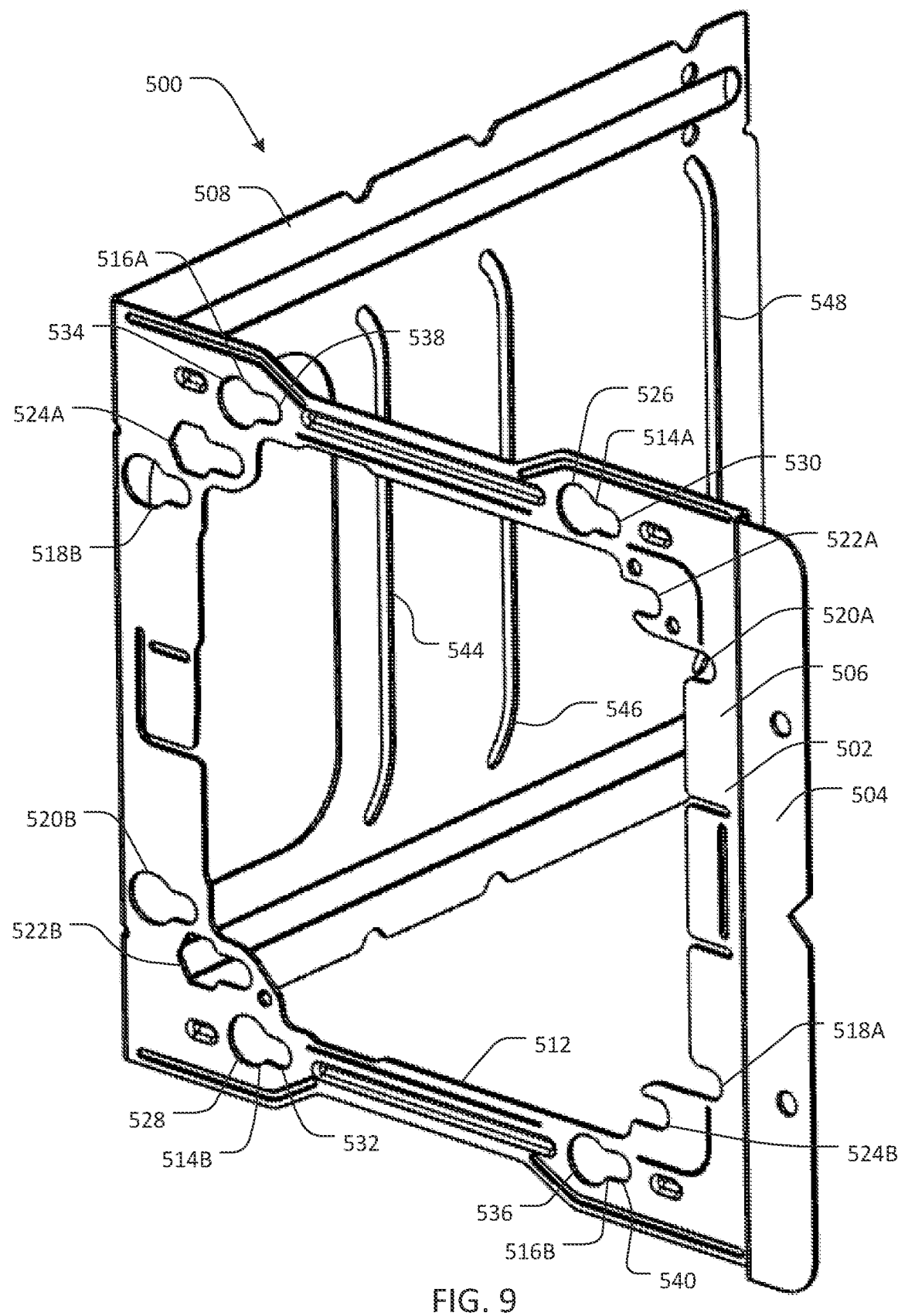
FIG. 9 is a front top right isometric view of a mounting bracket according to another embodiment of the invention.
Figure 10:
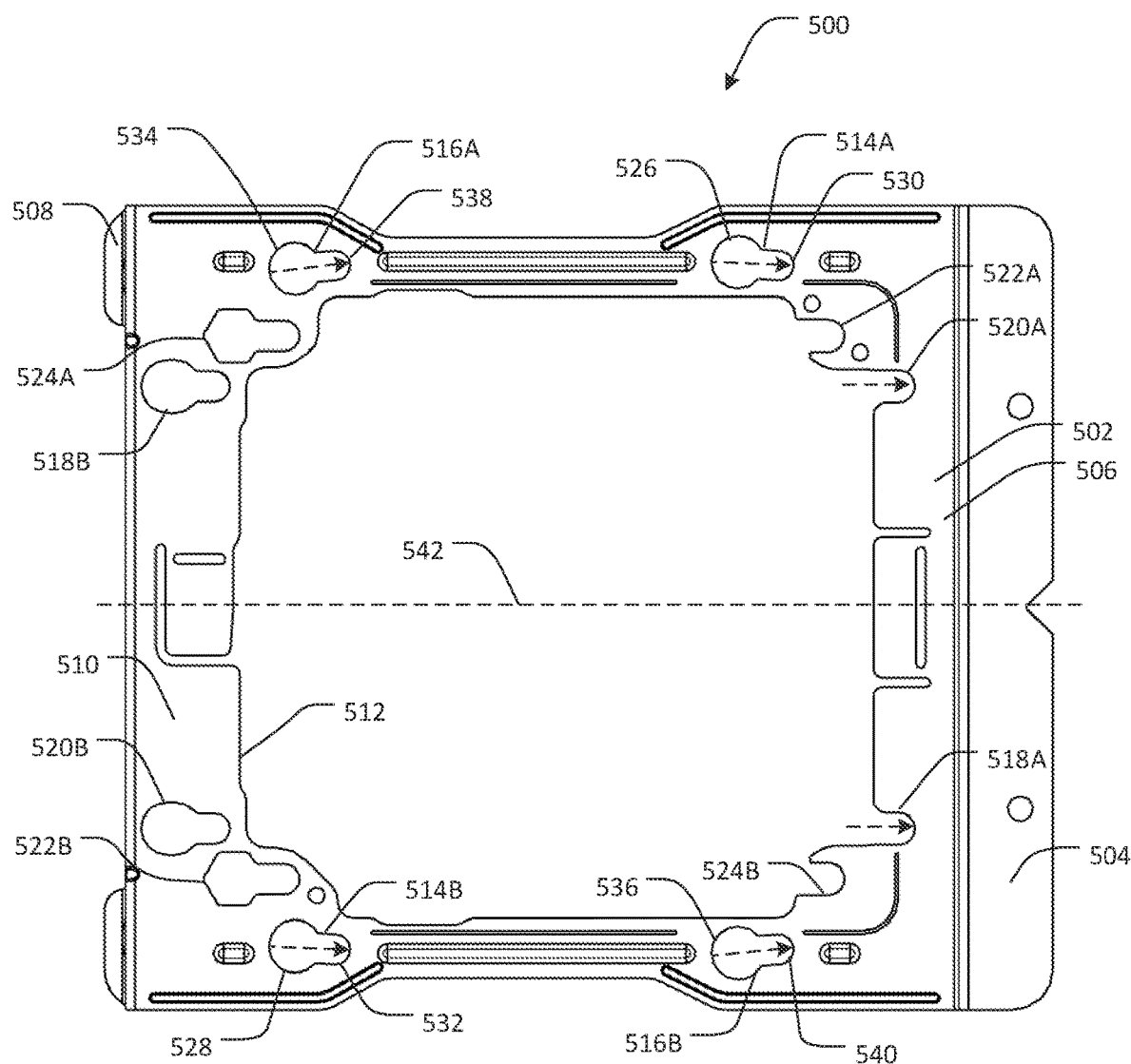
FIG. 10 is a front elevation view of the mounting bracket of FIG. 9.

FIGS. 9 and 10 illustrate another embodiment of a mounting bracket 500 according to the invention, as also can be configured to mount an electrical box 10 (shown in FIG. 1) thereto. In many aspects, the mounting bracket 500 is similar to the mounting bracket 400 described above and similar numbering in the 500 series is used for the mounting bracket 500. For example, the mounting bracket 500 has a mounting body 502, a mounting flange 504 on a first side 506, a far side support 508 on a second side 510, a central opening 512, a first set of mounting openings (including first and second mounting openings 514A, 514B, with receiving ends 526, 528 and terminal ends 530, 532, respectively), a second set of mounting openings (including third and fourth mounting openings 516A, 516B, with receiving ends 534, 536 and terminal ends 538, 540, respectively), a third set of mounting openings (including fifth and sixth mounting openings 518A, 518B), a fourth set of mounting openings (including seventh and eighth mounting openings 520A, 520B), a fifth set of mounting openings (including ninth and tenth mounting openings 522A, 522B), a sixth set of mounting openings (including eleventh and twelfth mounting openings 524A, 524B), and a mounting body axis 542.

In some aspects, however, the mounting brackets 400, 500 differ from each other. For example, the far side support 508 can be configured to accommodate wall depths of 2.5 in. when bent at a first relief 544, 3.625 in. when bent at a relief 546, 5.5 in. when bent at a relief 548, or 6 in. when left unbent (as shown in FIG. 9).

Figure 11:
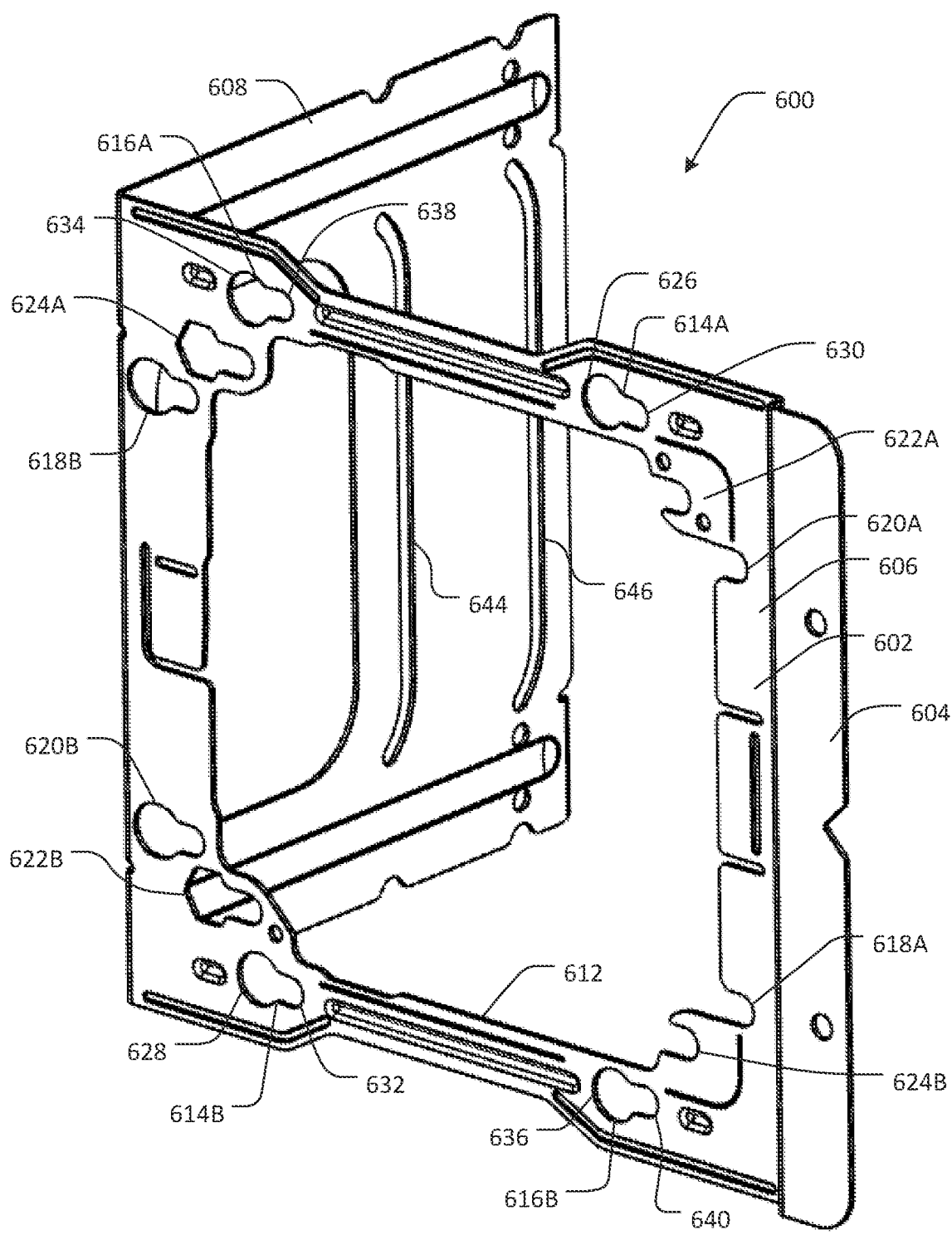
FIG. 11 is a front top right isometric view of a mounting bracket according to another embodiment of the invention.
Figure 12:
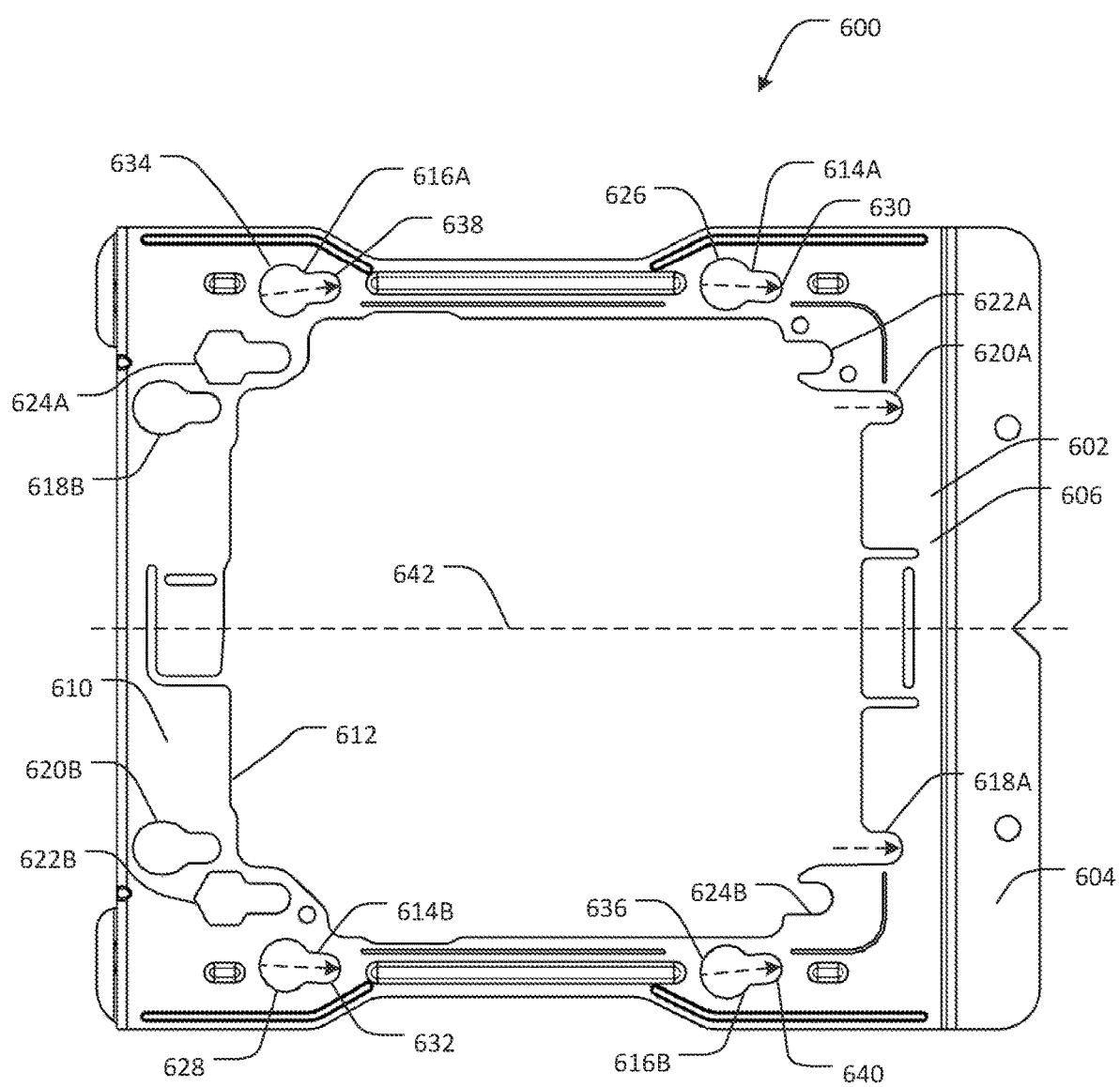
FIG. 12 is a front elevation view of the mounting bracket of FIG. 11.

FIGS. 11 and 12 illustrate another embodiment of a mounting bracket 600 according to the invention, as also can be configured to mount an electrical box 10 (shown in FIG. 1) thereto. In many aspects, the mounting bracket 600 is similar to the mounting bracket 400 described above and similar numbering in the 600 series is used for the mounting bracket 600. For example, the mounting bracket 600 has a mounting body 602, a mounting flange 604 on a first side 606, a far side support 608 on a second side 610, a central opening 612, a first set of mounting openings (including first and second mounting openings 614A, 614B, with receiving ends 626, 628 and terminal ends 630, 632, respectively), a second set of mounting openings (including third and fourth mounting openings 616A, 616B, with receiving ends 634, 636 and terminal ends 638, 640, respectively), a third set of mounting openings (including fifth and sixth mounting openings 618A, 618B), a fourth set of mounting openings (including seventh and eighth mounting openings 620A, 620B), a fifth set of mounting openings (including ninth and tenth mounting openings 622A, 622B), a sixth set of mounting openings (including eleventh and twelfth mounting openings 624A, 624B), and a mounting body axis 642.

In some aspects, however, the mounting brackets 400, 600 differ from each other. For example, the far side support 608 can be configured to accommodate wall depths of 2.5 in. when bent at a first relief 644, 3.625 in. when bent at a second relief 646, or 4 in. when left unbent (as shown in FIG. 11).

In other embodiments, other configurations are possible. For example, certain features and combinations of features that are presented with respect to particular embodiments in discussion above, can be utilized in other embodiments and in other combinations, as appropriate. In this regard, for example, different configurations of mounting features and apertures for mounting mud rings, and so on, as presented with respect to a particular one of the mounting brackets 100, 200, 300, 400, 500, 600 can be implemented in combination with features of the other mounting brackets 100, 200, 300, 400, 500, 600, or others.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

For example, with reference to FIG. 4, some embodiments can include an installation method under which a user can install an electrical box (e.g., the electrical box 10 shown in FIG. 1) to the mounting bracket 100. The method can include inserting the plurality of fasteners (e.g., fasteners 14 shown in FIG. 2) that are engaged with the electrical box 10 into the receiving ends 126, 128 of the first and second mounting openings 114A, 114B in the mounting body 102 of the mounting bracket 100 (shown in FIG. 2) and translating the fasteners into the terminal ends 130, 132 of the first and second mounting openings 114A, 114B by moving the electrical box at an oblique angle relative to the mounting bracket 100, generally, and also obliquely relative to the mounting body axis 242, in particular. The oblique movement of the fasteners 14 and the electrical box 10 relative to the mounting bracket 100 is illustrated by the arrows in the mounting openings 114A, 114B.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A mounting bracket for electrical boxes, the mounting bracket comprising:
   a mounting body having a plurality of mounting features, including a first set of mounting openings with respective elongate directions extending in parallel with each other, the mounting body having a mounting body axis extending laterally across a shortest distance between opposing first and second sides of the mounting body; and
   a mounting flange extending along the first side of the mounting body and configured to engage a wall support member to mount the mounting bracket thereto with the mounting body axis oriented parallel to ground;
   the elongate directions of the first set of mounting openings disposed at an acute angle between about 1 degree and about 5 degrees relative to the mounting body axis; and
   the first set of mounting openings being configured to receive a plurality of fasteners to attach an electrical box to the mounting bracket.

2. The mounting bracket of claim 1, wherein the mounting body includes a central opening configured to provide access to an interior of an attached electrical box.

3. The mounting bracket of claim 2, wherein the first set of mounting openings are keyhole openings positioned cater-cornered on the mounting body and adjacent the central opening.

4. The mounting bracket of claim 3, wherein the first set of mounting openings includes a first mounting opening with a receiving end and a terminal end and a second mounting opening with a receiving end and a terminal end;
   wherein the elongate direction for each of the first and second mounting openings extends from the respective receiving end to the respective terminal end;
   wherein the elongate direction for the first mounting opening extends toward the second side of the mounting body and away from the central opening and the elongate direction for the second mounting opening extends toward the second side of the mounting body and toward the central opening.

5. The mounting bracket of claim 4, further comprising a second set of mounting openings with respective elongate directions extending in parallel with each other;
   wherein the second set of mounting openings are positioned adjacent the central opening and on different corners of the mounting body than the first set of mounting openings, with the elongate directions of the second set of mounting openings disposed at an acute angle between about 1 degree and about 5 degrees relative to the mounting body axis.

6. The mounting bracket of claim 5, wherein the second set of mounting openings includes a third mounting opening with a receiving end and a terminal end and a fourth mounting opening with a receiving end and a terminal end;
   wherein the elongate direction for each of the third and fourth mounting openings extends from the respective receiving end to the respective terminal end;
   wherein the elongate direction for the third mounting opening extends toward the second side of the mounting body and toward the central opening and the elongate direction for the fourth mounting opening extends toward the second side of the mounting body and away from the central opening.

7. The mounting bracket of claim 3, wherein the first set of mounting openings includes a first mounting opening with a receiving end and a terminal end and a second mounting opening with a receiving end and a terminal end;
   wherein the elongate direction for each of the first and second mounting openings extends from the respective receiving end to the respective terminal end;
   wherein the elongate direction for the first mounting opening extends toward the first side of the mounting body and toward from the central opening and the elongate direction for the second mounting opening extends toward the first side of the mounting body and away from the central opening.

8. The mounting bracket of claim 7, further comprising a second set of mounting openings with respective elongate directions extending in parallel;
   wherein the second set of mounting openings are positioned adjacent the central opening and on different corners of the mounting body than the first set of mounting openings, with the elongate directions of the second set of mounting openings disposed at an acute angle between about 1 degree and about 5 degrees relative to the mounting body axis.

9. The mounting bracket of claim 8, wherein the second set of mounting openings includes a third mounting opening with a receiving end and a terminal end and a fourth mounting opening with a receiving end and a terminal end;
   wherein the elongate direction for each of the third and fourth mounting openings extends from the respective receiving end to the respective terminal end;

wherein the elongate direction for the third mounting opening extends toward the first side of the mounting body and away from the central opening and the elongate direction for the fourth mounting opening extends toward the first side of the mounting body and toward the central opening.

10. The mounting bracket of claim 9, further comprising a third set of mounting openings including a fifth mounting opening and a sixth mounting opening, wherein the fifth mounting opening is positioned on the first side of the mounting body and the sixth mounting opening is positioned on the second side of the mounting body, the fifth and sixth mounting openings extending along parallel elongate directions and in parallel with the mounting body axis.

11. The mounting bracket of claim 10, wherein the first set of mounting openings is configured to mount the electrical box in a first orientation and the third set of mounting slots is configured to mount the electrical box in a second orientation rotated 90 degrees from the first orientation.

12. A mounting bracket for electrical boxes, the mounting bracket comprising:
a mounting body having a plurality of mounting features, including a first set of mounting openings including a first mounting opening and a second mounting opening, and a second set of mounting openings including a third mounting opening and a fourth mounting opening;
the first mounting opening positioned adjacent a first side of the mounting body and the second mounting opening positioned adjacent a second side of the mounting body cater-cornered from the first mounting opening across a central opening, the first and second mounting openings extending along parallel elongate directions disposed at an oblique angle between about 1 degree and about 5 degrees relative to a mounting body axis configured to be horizontal relative to ground, upon installation of the mounting body; and
the third mounting opening positioned adjacent the second side of the mounting body laterally spaced from the first mounting opening and the fourth mounting opening positioned adjacent the first side of the mounting body cater-cornered from the third mounting opening across the central opening and laterally spaced from the second mounting opening, the third and fourth mounting openings extending along parallel elongate directions disposed at an oblique angle between about 1 degree and about 5 degrees relative to the mounting body axis.

13. The mounting bracket of claim 12, wherein the angle at which the elongate direction for the first and second mounting openings is disposed is positive relative to the mounting body axis, and the angle at which the elongate direction for the third and fourth mounting openings is disposed is negative relative to the mounting body axis.

14. The mounting bracket of claim 12, wherein each of the first, second, third, and fourth mounting openings have an elongate direction extending along a respective vector extending from an enlarged portion of the respective mounting opening configured to receive a head of a fastener to a respective narrower, slot portion configured to receive a shaft of the fastener,
wherein the elongate direction for each of the first, second, third, and fourth mounting openings extends toward the second side of the mounting body.

15. The mounting bracket of claim 12, wherein each of the first, second, third, and fourth mounting openings have an elongate direction extending along a respective vector extending from an enlarged portion of the respective mounting opening configured to receive a head of a fastener to a respective narrower, slot portion configured to receive a shaft of the fastener,
wherein the elongate direction for each of the first, second, third, and fourth mounting openings extends toward the first side of the mounting body.

16. The mounting bracket of claim 12, further comprising a third set of mounting openings including a fifth mounting opening and a sixth mounting opening, wherein the fifth mounting opening is positioned on the first side of the mounting body and the sixth mounting opening is positioned on the second side of the mounting body, the fifth and sixth mounting openings extending along parallel elongate directions and in parallel with the mounting body axis.

17. The mounting bracket of claim 16, wherein the first set of mounting openings is configured to mount the electrical box in a first orientation and the third set of mounting openings is configured to mount the electrical box in a second orientation rotated 90 degrees from the first orientation.

18. The mounting bracket of claim 16, further comprising a fourth set of mounting openings, wherein the first, second, and third sets of mounting openings are configured for mounting an electrical box of a first dimension and the fourth set of mounting openings is configured for mounting an electrical box of a second dimension different than the first dimension.

19. The mounting bracket of claim 12, further comprising a plurality of threaded holes configured to receive fasteners for directly mounting a mud ring to the mounting bracket.

20. A method of installing an electrical box on a mounting bracket, the method comprising:
selectively inserting a plurality of fasteners that are engaged with the electrical box into one of a first set or a second set of mounting openings in a mounting body of the mounting bracket, the mounting body having a mounting body axis extending laterally across a shortest distance between opposing first and second sides of the mounting body, the first set of mounting openings positioned cater-cornered in the mounting body relative to a central opening and having respective elongate directions that extend in parallel with each other and are disposed at an acute angle between about 1 degree and about 5 degrees relative to the mounting body axis, the second set of openings positioned cater-cornered in the mounting body relative to the central opening and at different corners of the central opening than the first set of mounting openings and having respective elongate directions that extend in parallel with each other and are disposed at an acute angle between about 1 degree and about 5 degrees relative to the mounting body axis; and
translating the fasteners within the mounting features by moving the box at an oblique angle_relative to the mounting body axis, to secure the electrical box to the mounting bracket.

* * * * *